US010103093B2

United States Patent
Sun et al.

(10) Patent No.: US 10,103,093 B2
(45) Date of Patent: Oct. 16, 2018

(54) VIA STRUCTURE FOR SIGNAL EQUALIZATION

(71) Applicant: Invensas Corporation, San Jose, CA (US)

(72) Inventors: Zhuowen Sun, Campbell, CA (US); Cyprian Emeka Uzoh, San Jose, CA (US); Yong Chen, Palo Alto, CA (US)

(73) Assignee: Invensas Corporation, San Jose, CA (US)

( * ) Notice: Subject to any disclaimer, the term of this patent is extended or adjusted under 35 U.S.C. 154(b) by 80 days.

(21) Appl. No.: 15/441,783

(22) Filed: Feb. 24, 2017

(65) Prior Publication Data

US 2017/0171003 A1 Jun. 15, 2017

Related U.S. Application Data

(62) Division of application No. 14/206,756, filed on Mar. 12, 2014, now Pat. No. 9,583,417.

(51) Int. Cl.
*H01L 23/498* (2006.01)
*H01L 23/48* (2006.01)
(Continued)

(52) U.S. Cl.
CPC ...... *H01L 23/49827* (2013.01); *H01L 21/486* (2013.01); *H01L 23/481* (2013.01);
(Continued)

(58) Field of Classification Search
CPC ............ H01L 23/49827; H01L 23/481; H01L 23/5384; H01L 23/53238;
(Continued)

(56) References Cited

U.S. PATENT DOCUMENTS 6,995,322 B2 * 2/2006 Chan .................. H01L 23/5383
174/260
7,566,913 B2 7/2009 Therrien et al.
(Continued)

OTHER PUBLICATIONS

International Search Report and Written Opinion dated Aug. 6, 2015, Intl. Application No. PCT/US2015/019991, filed Mar. 11, 2015.
(Continued)

*Primary Examiner* — Michael Trinh

(57) ABSTRACT

An apparatus relating generally to a substrate is disclosed. In such an apparatus, the substrate has a first surface and a second surface opposite the first surface. The first surface and the second surface define a thickness of the substrate. A via structure extends from the first surface of the substrate to the second surface of the substrate. The via structure has a first terminal at or proximate to the first surface and a second terminal at or proximate to the second surface provided by a conductive member of the via structure extending from the first terminal to the second terminal. A barrier layer of the via structure is disposed between at least a portion of the conductive member and the substrate. The barrier layer has a conductivity configured to offset a capacitance between the conductive member and the substrate when a signal is passed through the conductive member of the via structure.

20 Claims, 9 Drawing Sheets

(51) Int. Cl.
  *H01L 25/065* (2006.01)
  *H01L 23/538* (2006.01)
  *H01L 21/48* (2006.01)
  *H01L 23/532* (2006.01)
  *H01L 23/00* (2006.01)

(52) U.S. Cl.
  CPC .... H01L 23/5384 (2013.01); H01L 23/53238 (2013.01); H01L 24/73 (2013.01); H01L 25/0657 (2013.01); *H01L 2224/16145* (2013.01); *H01L 2224/32145* (2013.01); *H01L 2224/73253* (2013.01); *H01L 2225/06513* (2013.01); *H01L 2225/06541* (2013.01)

(58) Field of Classification Search
  CPC . H01L 2224/16145; H01L 2224/32145; H01L 2224/73253; H01L 2225/06541; H01L 25/0657; H01L 24/16; H01L 24/32; H01L 24/73; H01L 21/486
  See application file for complete search history.

(56) References Cited

U.S. PATENT DOCUMENTS

| | | | |
|---|---|---|---|
| 7,633,167 B2 | 12/2009 | Kawano et al. | |
| 8,076,234 B1 | 12/2011 | Park et al. | |
| 8,426,308 B2 | 4/2013 | Han et al. | |
| 8,492,272 B2 | 7/2013 | Adkisson et al. | |
| 8,501,587 B2 | 8/2013 | Chen et al. | |
| 8,791,009 B2 | 7/2014 | Farooq et al. | |
| 8,877,559 B2 | 11/2014 | Gao et al. | |
| 9,070,748 B2 | 6/2015 | Kang et al. | |
| 9,076,715 B2 | 7/2015 | Tsai et al. | |
| 9,087,821 B2 | 7/2015 | Lin | |
| 9,105,628 B1 | 8/2015 | Dubin | |
| 9,123,789 B2 | 9/2015 | Lin et al. | |
| 9,153,522 B2 | 10/2015 | Moon et al. | |
| 9,240,330 B2 * | 1/2016 | Takeda | H01L 21/486 |
| 9,287,197 B2 | 3/2016 | Lin et al. | |
| 9,299,572 B2 | 3/2016 | Gao | |
| 9,570,377 B2 | 2/2017 | Jin et al. | |
| 2011/0291287 A1 | 12/2011 | Wu et al. | |
| 2012/0235305 A1 | 9/2012 | Kim et al. | |
| 2013/0020719 A1 * | 1/2013 | Jung | H01L 21/76898 257/774 |
| 2013/0119555 A1 * | 5/2013 | Sundaram | H01L 21/486 257/774 |
| 2014/0008652 A1 * | 1/2014 | Hsu | H01L 23/481 257/52 |
| 2014/0042617 A1 | 2/2014 | Uchiyama | |
| 2015/0021771 A1 | 1/2015 | Lin | |
| 2015/0028450 A1 | 1/2015 | Park et al. | |
| 2015/0137387 A1 | 5/2015 | Choi et al. | |
| 2015/0243582 A1 | 8/2015 | Klewer | |

OTHER PUBLICATIONS

Kim, Joohee et al., "Through Silicon Via (TSV) Equalizer", Electrical Performance of Electronic Packaging and Systems, 2009. EPEPS '09, IEEE 18th Conference on IEEE, Piscataway, NJ, US, Oct. 19, 2009, pp. 13-16.

* cited by examiner

VIA STRUCTURE FOR SIGNAL EQUALIZATION

CROSS-REFERENCE TO RELATED APPLICATION(S)

This application is a divisional of, and hereby claims priority to, U.S. patent application Ser. No. 14/206,756, filed on Mar. 12, 2014 (to be issued as U.S. Pat. No. 9,583,417 on Feb. 28, 2017), the entirety of which is hereby incorporated by reference herein for all purposes.

FIELD OF THE INVENTION

The following description relates to integrated circuit devices ("ICs"). More particularly, the following description relates to a via structure for signal equalization for communication within an IC or between ICs.

BACKGROUND OF THE INVENTION

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive die or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example.

An IC die or an interposer may be coupled to traces or terminals, so a packaged microelectronic element may be mounted to a circuit panel by bonding traces or terminals of such circuit panel to contacts, such as contact pads for example, on such IC die or interposer. For example, some IC dies and some interposers used in microelectronic packaging have terminals in the form of exposed ends of pins or posts extending through a dielectric layer. In other applications, terminals of an IC die or interposer may be externally accessible pads or portions of traces formed on an RDL.

Conventionally, via structures, including without limitation, through-silicon vias ("TSVs") have had a dielectric liner capacitance causing frequency-dependent signal attenuation ("signal loss"). More particularly, low frequency signals passed through such vias with little signal loss in comparison to high frequency signals. Such signal loss degraded performance of high-speed applications, including without limitation in stacked die assemblies with cascaded TSVs. Along those lines, a signal "eye" conventionally had a significant amount of jitter due to such difference between low and high frequency signal loss.

Accordingly, it would be desirable and useful to reduce signal eye jitter.

SUMMARY OF THE INVENTION

An apparatus relates generally to a substrate. In such an apparatus, the substrate has a first surface and a second surface opposite the first surface. The first surface and the second surface define a thickness of the substrate. A via structure extends from the first surface of the substrate to the second surface of the substrate. The via structure has a first terminal at or proximate to the first surface and a second terminal at or proximate to the second surface provided by a conductive member of the via structure extending from the first terminal to the second terminal. A barrier layer of the via structure is disposed between at least a portion of the conductive member and the substrate. The barrier layer has a conductivity configured to offset a capacitance between the conductive member and the substrate when a signal is passed through the conductive member of the via structure.

Another apparatus relates generally to a semiconductor substrate. In such an apparatus, the semiconductor substrate has a first surface and a second surface opposite the first surface. The first and second surfaces define a substrate thickness of the semiconductor substrate. A via structure extends from the first surface of the semiconductor substrate to the second surface of the semiconductor substrate. The via structure has a first terminal at or proximate to the first surface and a second terminal at or proximate to the second surface. The via structure further has a conductive member extending from the first terminal to the second terminal. A barrier layer of the via structure is disposed between at least a portion of the conductive member and the semiconductor substrate. A liner layer of the via structure is disposed between at least a portion of the barrier layer and the semiconductor substrate. The barrier layer and the liner layer in combination provide a current conduction path configured to offset an effect of a parasitic capacitance that arises between the conductive member and the semiconductor substrate when a signal is passed through the conductive member of the via structure.

A method relates generally to a substrate. In such a method, the obtained substrate has a plurality of through-substrate vias. An input signal is sent to a through-substrate via of the plurality of through-substrate vias. Signal weight loss of the input signal is equalized by passing through the through-substrate via. The plurality of through-substrate vias have lossy interfaces to the substrate to increase the signal weight loss at low frequencies for equalization of the input signal. The through-substrate via has a conductive current path from a conductive member of the through-substrate via to the substrate for equalization of the input signal. An output signal is obtained from the through-substrate via as an equalized form of the input signal.

BRIEF DESCRIPTION OF THE DRAWINGS

Accompanying drawing(s) show exemplary embodiment(s) in accordance with one or more aspects of exemplary apparatus(es) and/or method(s). However, the accompanying drawings should not be taken to limit the scope of the claims, but are for explanation and understanding only.

DETAILED DESCRIPTION OF THE DRAWINGS

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
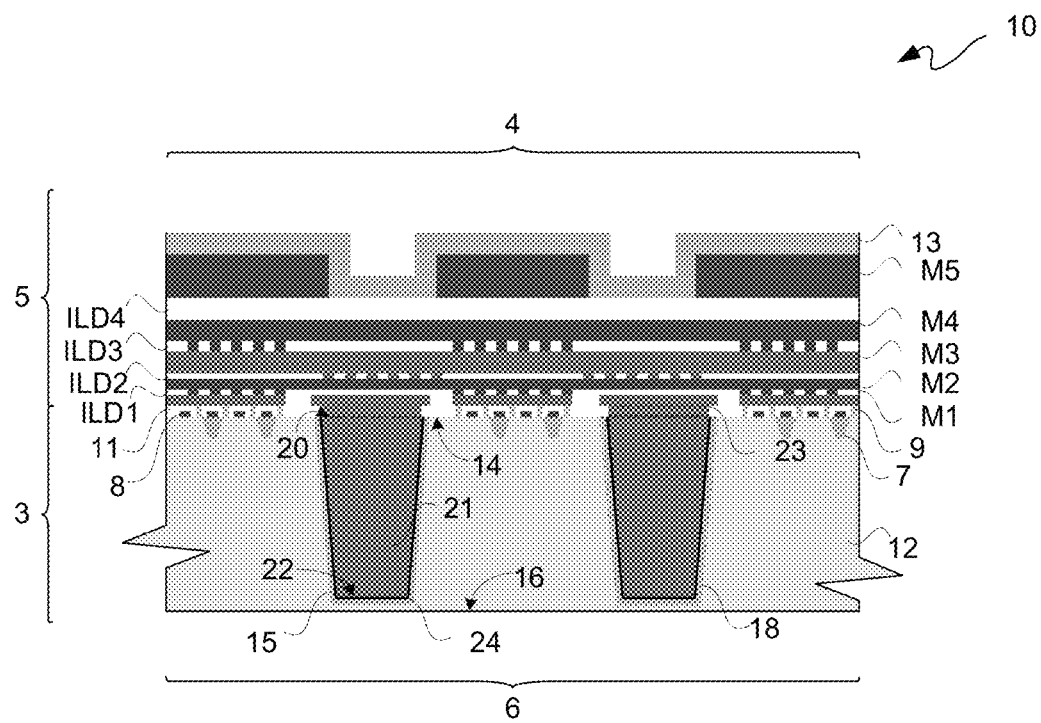
FIG. 1A is a schematic diagram of a cross-sectional view depicting an exemplary portion of an in-process wafer for providing an integrated circuit ("IC") die.

FIG. 1A is a schematic diagram of a cross-sectional view depicting an exemplary portion of an in-process wafer for providing a die component, such as an IC die 10. IC die 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC die 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization. Such passivation level 13 may include one or more dielectric layers, and further may include an anti-reflective coating ("ARC").

As part of a FEOL or BEOL structure formation, a plurality of via structures 18 may extend within openings formed in substrate 12 which extend into substrate 12. Via structures 18 may be generally can be in the form of any solid of any shape formed by filling an opening formed in substrate 12. Examples of such solids generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011, and U.S. patent applications Ser. Nos. 12/842,717 and 12/842,651 both filed on Jul. 23, 2010, and each of these patent applications is hereby incorporated by reference herein for all purposes to the extent same is consistent with the description hereof.

Initially, conventionally via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stand for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any conductive portions of a via structure 18 and substrate 12 such that electronic signal, ground, supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating, and thus barrier layer 24 may be referred to as a barrier/seed layer. Furthermore, barrier layer 24 may provide an adhesion layer for adherence of a subsequently deposited metal. Examples of materials that may be used for barrier layer 24 include tantalum (Ta), tantalum nitride (TaN), palladium (Pd), titanium nitride (TiN), or TaSiN, among others.

Via structures 18 may generally consist of a metallic or other conductive material generally filling a remaining void in an opening formed in substrate 12 to provide a via conductor 21. In various examples, a via conductor 21 of a via structure 18 may be generally consist of copper or a copper alloy. However, a via conductor 21 may additionally or alternatively include one or more other conductive materials such as tantalum, nickel, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through respective contact pad 23. Contact pads 23 may be formed in respective openings formed in PMD 11 in which M1 extends. However, in other configurations, one or more via conductors 21 may be extended to one or more other higher levels of metallization through one or more ILDs. Furthermore, via structure 18 is what may be referred to as a front side TSV, as an opening used to form via structure is initially formed by etching from a front side of substrate 12.

Figure 1B:
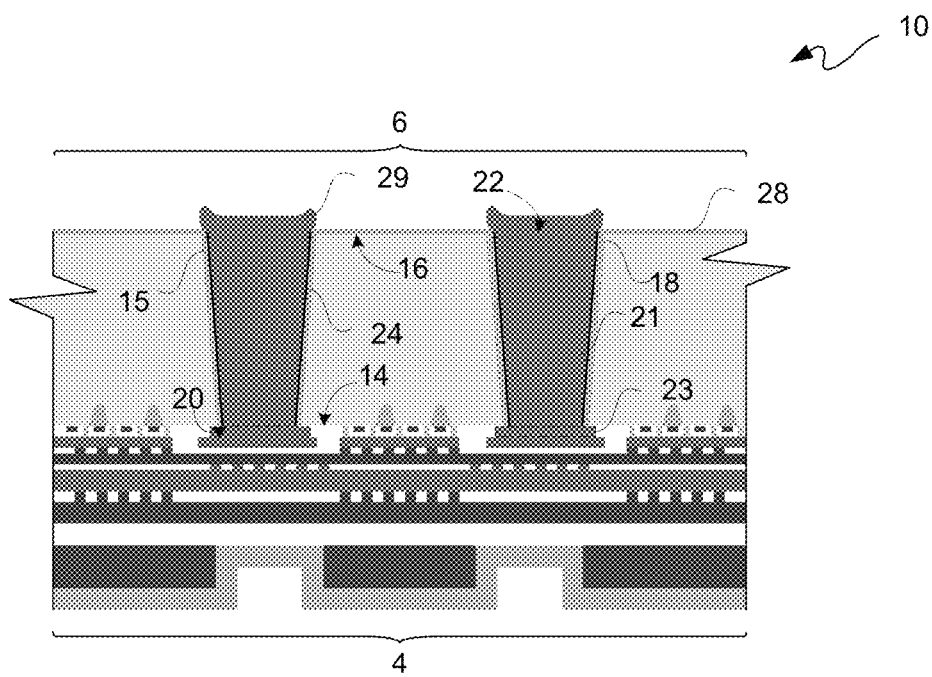
FIG. 1B is a schematic diagram of a cross-sectional view depicting an exemplary portion of an in-process wafer for providing another IC die.

However, via structure 18 may be a backside TSV, as generally indicated in FIG. 1B, where there is shown a schematic diagram of a cross-sectional view depicting an exemplary portion of an in-process wafer for providing another IC die 10. Fabrication of a backside TSV is generally referred to as a "via last approach," and accordingly fabrication of a front side TSV is generally referred to as a "via first approach." IC die 10 includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump landings 29. Optionally, a conventional anisotropic silicon etch may be used prior to depositing and patterning a polymer isolation layer as liner 15.

For purposes of clarity by way of example and not limitation, shall be assumed that front side TSVs are used, as such description is equally applicable to backside TSVs.

Figure 1C:
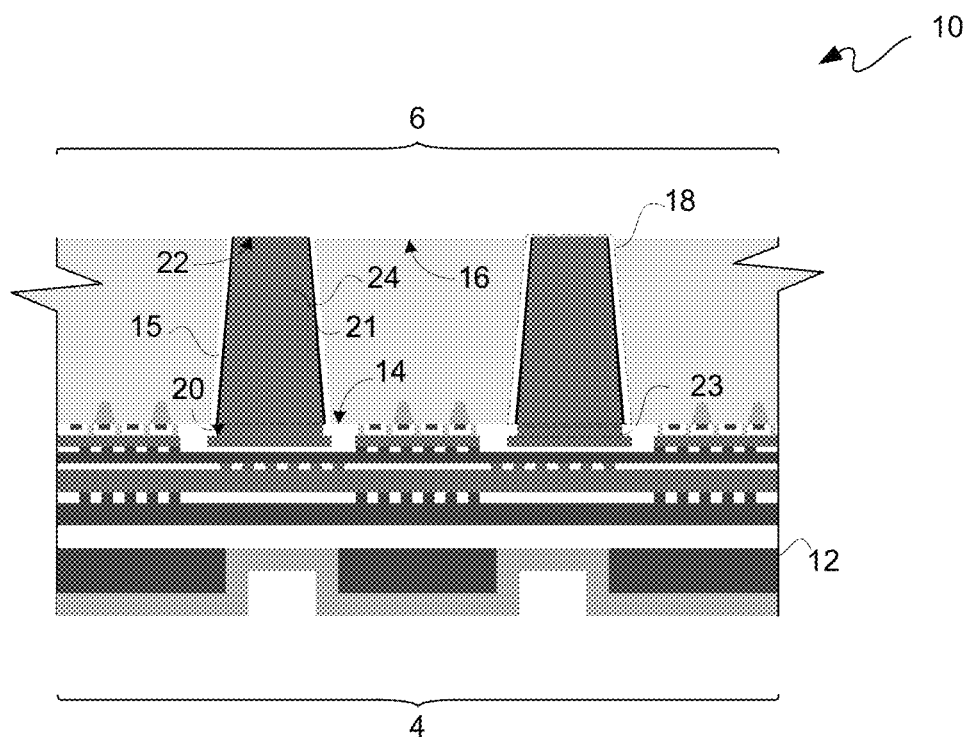
FIG. 1C is the diagram of FIG. 1A with the IC die vertically flipped after chemical-mechanical-polishing of a lower surface of a substrate of the IC die.

FIG. 1C is the diagram of FIG. 1A with IC die 10 after a chemical-mechanical-polishing ("CMP") of a lower surface 16 of a substrate 12. Such CMP may be performed to reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
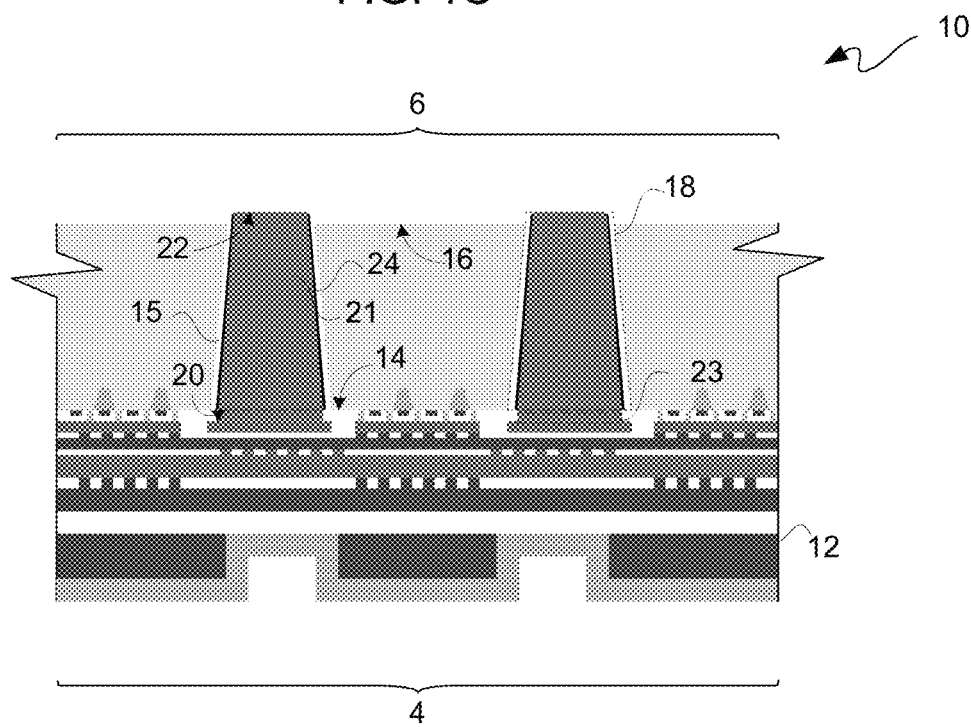
FIG. 1D is the diagram of FIG. 1A with the IC die vertically flipped after a backside etch of a lower surface of a substrate of the IC die to reveal a lower end contact surface of a via conductor thereof.

FIG. 1D is the diagram of FIG. 1A with IC die 10 after a backside etch of a lower surface 16 of substrate 12 to reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, it shall be IC die 10 of FIG. 1D is further described, as the following description may likewise apply to IC die 10 of FIG. 1C.

Figure 1E:
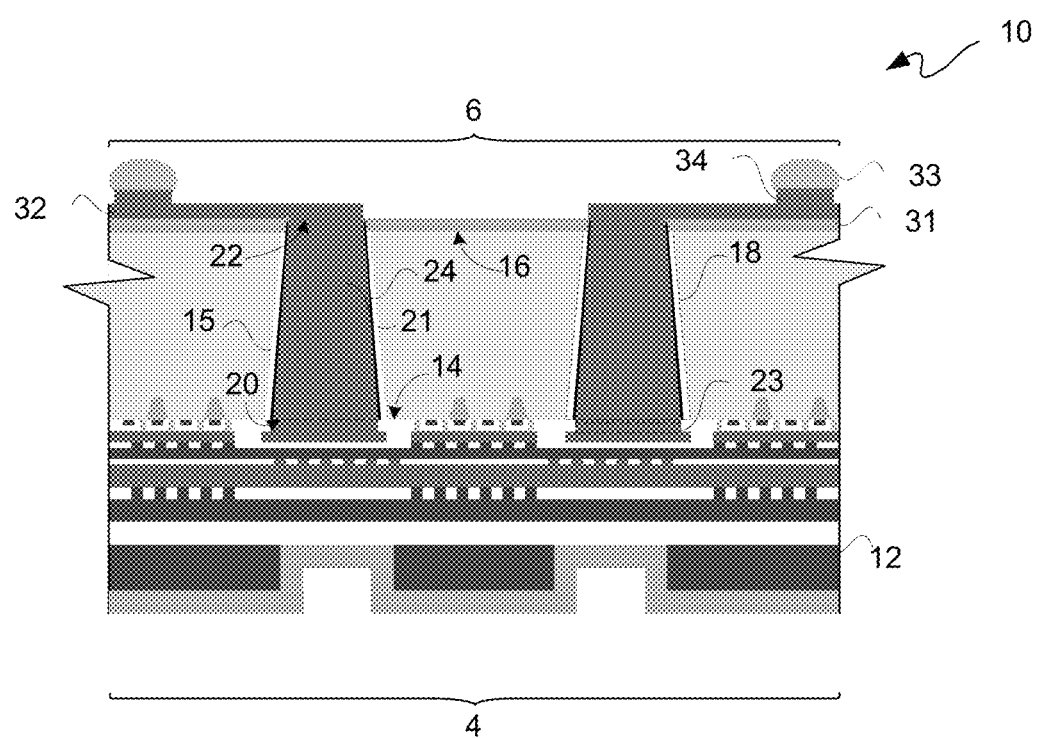
FIG. 1E is the diagram of FIG. 1D with a lower surface of the IC die having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzo-cyclobutene (BCB) layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be a redistribution layer ("RDL"). Balls 33 may be respectively formed on pads 34, where such pads are formed on or as part of metal layer 32. Balls 33 may be formed of a bonding material, such as solder or other bonding material. Balls 33 may be micro bumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using in part TSVs may be performed at a bond pad level or an on-chip electrical wiring level. Dies 10 may be diced from a wafer into single dies. Such single dies may be bonded to one another or bonded to a landing die, such as an interposer die ("interposer") or chip carrier, herein after collectively and singly "interposer."

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through the layer of semiconductor material. The conductive vias can be used for signal transmission through the interposer. In some interposers, ends of the vias may be used as contact pads for connection of the interposer to other microelectronics components. In other examples, one or more redistribution layers may be formed as part of the interposer on one or more sides thereof and connected with one or both ends of such vias. A redistribution layer may include numerous conductive traces extending on or within one or more dielectric sheets or layers. The traces can be provided in one level or in multiple levels throughout a single dielectric layer, separated by portions of dielectric material within the layer. Vias may be included in a redistribution layer to interconnect traces in different levels of such redistribution layer.

Figure 2A:
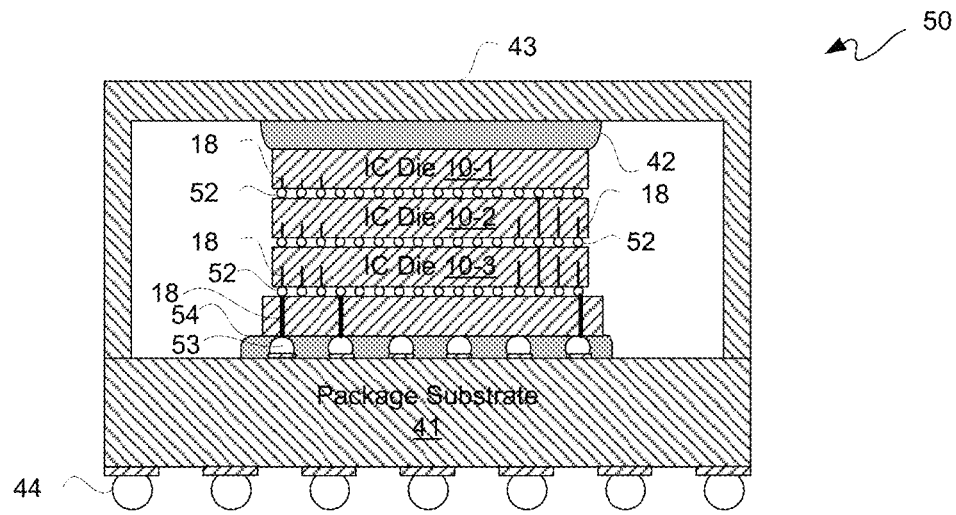
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package may include TSV interconnects, use of via structures 18 for a 3D IC packaged component 50 is described for purposes of clarity by way of example. In this example of a 3D IC packaged component 50, there are three IC die 10, namely IC dies 10-1, 10-2, 10-3, stacked one upon the other. In other implementations, there may be fewer or more than three IC die 10 in a stack. IC dies 10 may be bonded to one another using microbumps or flip chip solder bumps ("microbumps") 52. Optionally, Cu pillars extending from a backside of a die may be used. Some of these microbumps 52 may be interconnected to via structures. For example, a Cu/Sn microbump transient liquid phase ("TLP") bonding technology may be used for bonding IC dies to one another. Thus, interconnect layers may be on one upper or lower side or both upper and lower sides of an IC die 10 of a 3D stack.

A bottommost IC die 10-3 of such 3D stack optionally may be coupled to an interposer die ("interposer") 40. Interposer 40 may be an active die or a passive die. For purposes of clarity and not limitation, it shall be assumed that interposer 40 is a passive die. IC die 10-3 may be coupled to interposer 40 by microbumps 52. Interposer 40 may be coupled to a package substrate, such as a BT or ceramic substrate. An under fill 54 for a flip chip attachment may encapsulate C4 bumps or other solder balls 53 used to couple interposer die 40 and package substrate 41. A spreader/heat sink ("heat sink") 43 may be attached to package substrate 41, and such heat sink 43 and substrate package 41 in combination may encase IC dies 10 and interposer 40 of such 3D stack. A thermal paste 42 may couple an upper surface of IC die 10-1 on top of such 3D stack to an upper internal surface of such heat sink 43. Ball grid array ("BGA") balls or other array interconnects 44 may be used to couple package substrate 41 to a circuit platform, such as a printed circuit board ("PCB") for example.

Figure 2B:
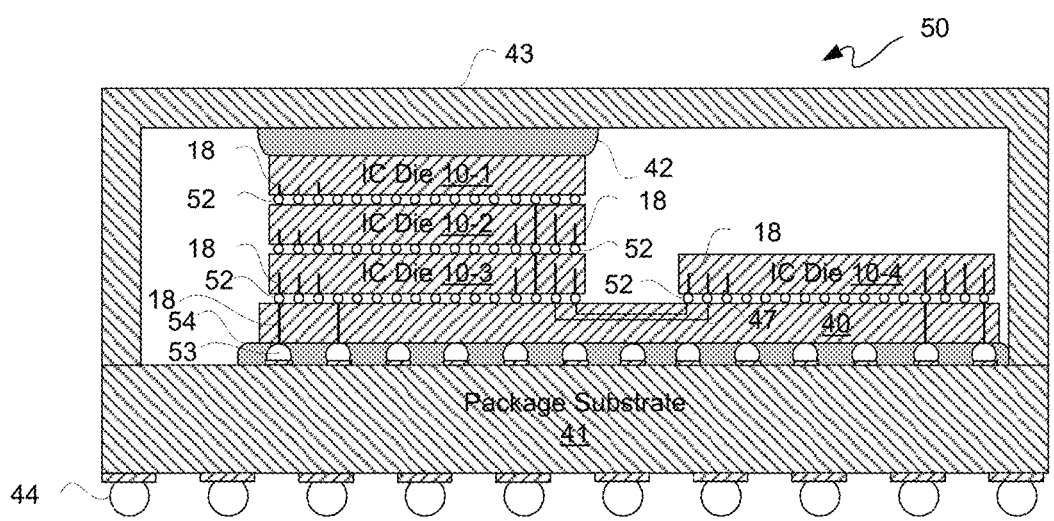
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences. In FIG. 2B, another IC die 10-4 is separately coupled via microbumps 52 to interposer 40, where IC die 10-4 is not coupled in the stack of IC dies 10-1, 10-2, 10-3. Furthermore, interposer 40 includes metal and via layers for providing wires 47 for interconnecting IC dies 10-3 and 10-4. Furthermore, interposer 40 includes via structures 18 coupled to IC die 10-4 through microbumps 52.

3D wafer-level packaging ("3D-WLP") may be used for interconnecting two or more IC dies, one or more IC dies to an interposer, or any combination thereof, where interconnects thereof may use via structures 18. Optionally, IC dies may be interconnected die-to-die ("D2D") or chip-to-chip ("C2C"), where interconnects thereof may use via structures 18. Further, optionally, IC dies may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

Figure 3:
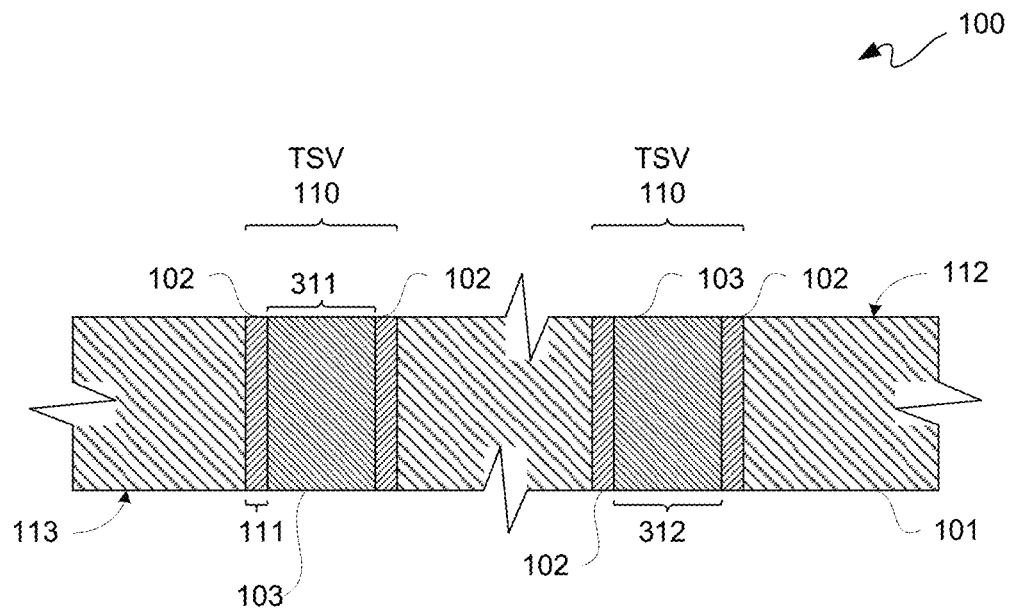
FIG. 3 is a block diagram depicting a cross-sectional view of a substrate having via structures.
Figure 5:
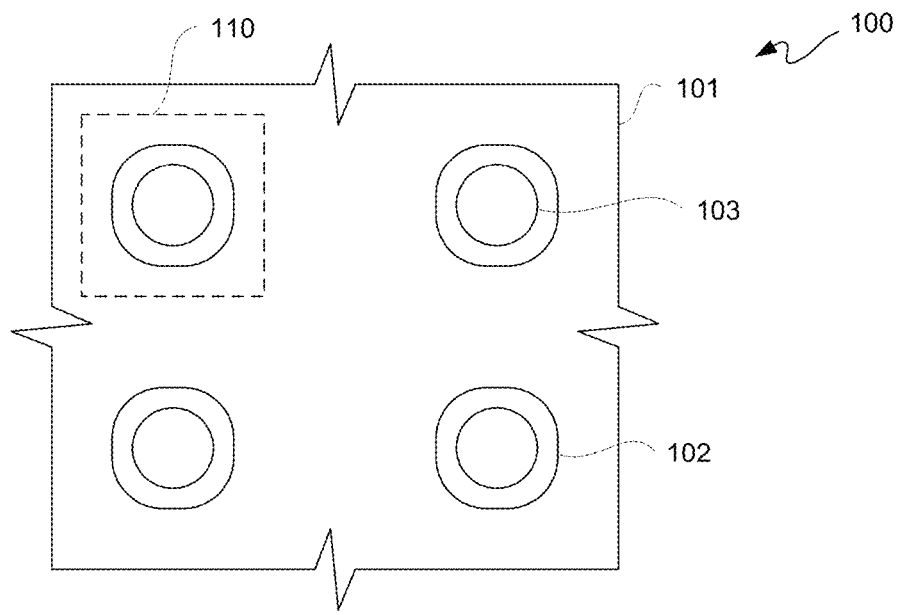
FIG. 5 is a block diagram depicting a top view of the substrate of FIG. 3.

FIG. 3 is a block diagram depicting a cross-sectional view of a substrate 100 having via structures. FIG. 5 is a block diagram depicting a top view of substrate 100 of FIG. 3. With simultaneous reference to FIGS. 3 and 5, substrate 100 is further described.

In this example, a through substrate via, such as through-silicon-vias ("TSVs") 110, are illustratively depicted for a silicon substrate layer 101. However, in other examples, other types of vias may be used. Furthermore, even though TSVs 110 are illustratively depicted, in other examples substrate layer 101 may be another type of semiconductor substrate, and thus any through-substrate-via may be used in accordance with the following description where a parasitic capacitance is present due to a via structure in a substrate, as described below in additional detail.

TSVs 110 each include a conductive member 103 and a barrier layer 102. TSVs 110 include no liner layer, such as may be formed of a dielectric such as $SiO_2$ or a polymeric layer or inorganic layer for example. Conductive member 103 may have a terminal or end 311 at or proximate to upper surface 112 and an opposite terminal or end 312 at or proximate to lower surface 113.

Barrier layer 102 may be disposed along a sidewall of conductive member 103. Because substrate layer 101 may have a dopant so as to be conductive, such conductive member 103-barrier layer 102-substrate layer 101 in combination may create a parasitic capacitance or parasitic capacitor, as barrier layer 102, as well as conductive member 103, includes a metal and may be a conductive compound. In this example, TSVs 110 have no liner layer, and barrier layer 102 is formed to provide a film whose resistivity is in a range of approximately 15 micro Ohm-cm to 0.5 Ohm-cm. Along those lines, barrier layer 102 may have a thickness 111 in a range of approximately 0.1 to 5000 nm, but preferably between approximately 1 to 50 nm, which may vary with a metal-based compound used for barrier layer. Parasitic capacitance for TSVs 110 may be in a range of approximately 20 to 25000 femtofarads ("fF"), but preferably in a range of approximately 50 to 2500 fF for a 100 micrometer long TSV with 10 micrometer in diameter.

Barrier layer 102 includes a dielectric material, as well as a metal. Examples of materials that may be used for barrier layer 102 include compounds of titanium, tantalum, molybdenum, tungsten, nickel, and various combinations thereof, and may further include a dielectric material. In some applications, the compounds or alloys may be laminated with other compounds or with metallic materials. In one example, barrier layer 102 may for example include TaN, TiN, TaSiN, TaSiN, molybdenum silicide or other silicides. The laminates may for example include TaSiN/Ta, TiSiW, TaSiW, MoSi/Mo, TiN/Ti, TaN/TiN and the like. Barrier layer 102 as a compound may be stoichiometric or non-stoichiometric in composition. In one implementation, the resistivity of barrier layer 102 may be in grades. For example, barrier layer 102 may include a βTa/αTa laminate, where the resistivity of such beta tantalum is more than 5 times higher than that of such alpha tantalum. Barrier layer 102 and conductive member 103 may extend contiguously from a top surface 112 to a bottom surface 113 of substrate layer 101. In one implementation, barrier layer 102 may be discontinuous. Conductive member 103 may be Cu, W, Ni, Al, Au, Pt or another metal.

In one implementation, conductive member 103 may be an alloy material, consisting or two or more elements. In one implementation, conductive member 103 may include a light coupling or transmitting material. In some implementations, barrier layer 102 has a significantly higher resistance than a conventional barrier layer for a TSV with a copper conductor. In some implementations, barrier layer 102 is more conductive than a conventional barrier layer, as well as more resistive than a conventional barrier layer. Thus, barrier layer 102 may effectively emulate at least in part a leaky dielectric to provide a current conduction path. Along those lines, a film or sheet resistor may have a resistivity as low as approximately as low as 15 micro Ohm-cm; however, other sheet resistances may be used as may vary from application to application. Generally, barrier layer 102 may have a film resistivity equal to or less than approximately 0.5 Ohm-cm.

Forming, such as by deposition of TaN or Ta, of barrier layer 102 may be deposited in a controlled manner to have a resistivity within a predetermined range. Such controlled formation of a barrier layer is described in additional detail in U.S. Pat. Nos. 6,339,258, 6,437,440, and 6,569,783, each of which is incorporated by reference herein in its entirety for all purposes.

Figure 4:
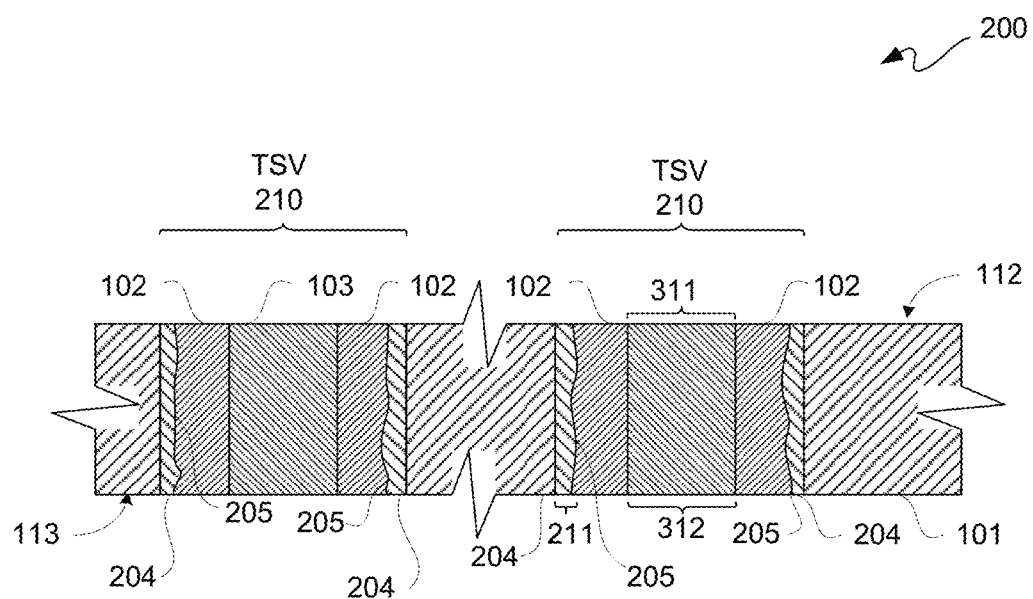
FIG. 4 is a block diagram depicting a cross-sectional view of another substrate having via structures.
Figure 6:
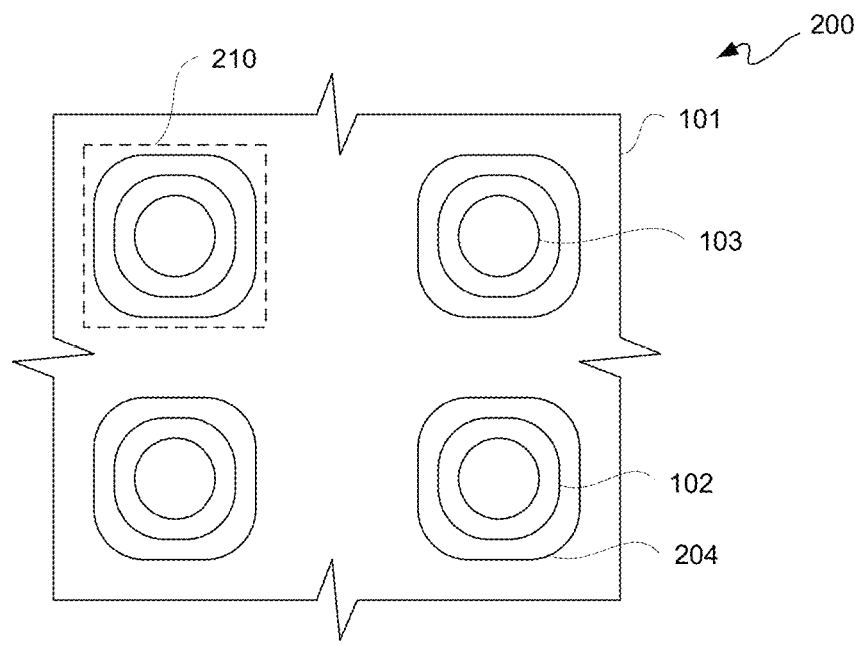
FIG. 6 is a block diagram depicting a top view of the substrate of FIG. 4.

FIG. 4 is a block diagram depicting a cross-sectional view of a substrate 200 having via structures. FIG. 6 is a block diagram depicting a top view of substrate 200 of FIG. 4. With simultaneous reference to FIGS. 4 and 6, substrate 200 is further described.

In this example, TSVs 210 are illustratively depicted for a silicon substrate layer 101. However, in other examples, other types of vias or substrates may be used. Furthermore, even though TSVs 210 are illustratively depicted, in other examples substrate layer 101 may be another type of semiconductor substrate, and thus any through-substrate-via may be used in accordance with the following description where a parasitic capacitance is present due to a via structure in a substrate, as described below in additional detail.

TSVs 210 each include a conductive member 103, a barrier layer 102, and a liner layer 204. Barrier layer 102 may be disposed along a sidewall of conductive member 103, and liner layer 204 may be disposed along a sidewall of barrier layer 102. Because substrate layer 101 may have a dopant so as to be conductive, such conductive member 103-barrier layer 102-liner layer 204-substrate layer 101 in combination may create a parasitic capacitance or parasitic capacitor and a resistor in parallel. Again, barrier layer 102, as well as conductive member 103, includes a metal and may be a conductive compound. Conductive member 103 may have a terminal or end 311 at or proximate to upper surface 112 and an opposite terminal or end 312 at or proximate to lower surface 113.

Resistance provided by barrier layer 102 generally may be no more than two orders of magnitude greater than a resistivity of an n-type or p-type doped substrate layer 101, and thus such resistor or resistance provided by barrier layer 102 may appear as an "open" in comparison to substrate layer 101. In this example, barrier layer 102 is formed to provide a film resistivity in a range of approximately 15 micro to 0.5 Ohm-cm. Along those lines, barrier layer 102 may have a thickness 211 in a range as previously described, but for purposes of clarity by way of example and not limitation shall be assumed to be in a range of approximately 1 to 50 nm for this example, which thickness may vary with a metal-based compound used for barrier layer, as well as may vary with liner layer 204. Barrier layer 102, as previously described, may be formed to have a low resistivity, as may vary from application to application. Thus, while generally there is an upper limit for sheet resistance of barrier layer 102 to be effective, such sheet resistance need not reach such upper limit, as lower resistivity is usable. However, barrier layer 102 in combination with liner layer 204 may provide a film whose resistivity is higher than that of barrier layer 102 alone, as liner layer 204 may have a resistivity less than or equal to approximately 300 Ohm-cm.

In this example, liner layer 204 is a substantially porous material or electrically porous or electrically partially porous or electrically leaky, so when barrier layer 102 is deposited, such deposited material of barrier layer 102 fills voids or interstices in a surface of liner layer 204. For example, barrier layer 102 may be conformally deposited onto such rough surface of liner layer 204. Thus, a junction 205 between liner layer 204 and barrier layer 102 may be rough, as generally indicated by wavy lines for junctions 205. Again, barrier layer 204 includes a metal in order to provide a resistance in parallel with a capacitance associated in part with a dielectric material of liner layer 204. Parasitic capacitance for TSVs 210 may vary from application to application in accordance with the description herein. Examples of materials that may be used for barrier layer 102 include compounds of titanium, tantalum, molybdenum, tungsten, nickel, silicon and various combination thereof, and may include a dielectric material. In some applications, compounds or alloys may be laminated with other compounds or with metallic materials. In one example, barrier layer 102 may for example include TaN, TiN, TaSiN, TaSiN, molybdenum silicide or other silicides. Such laminates may include for example TaSiN/Ta, TiSiW, TaSiW, MoSi/Mo, TiN/Ti, TaN/TiN and the like. A barrier layer 102 compound may be stoichiometric or non-stoichiometric in composition. In one example, resistivity of barrier layer 102 may be grades. For example, barrier layer 102 may include a βTa/αTa laminate, where resistivity of such beta tantalum is more than 5 times higher than that of such alpha tantalum. Barrier layer 102 and conductive member 103 may extend contiguously from a top surface 112 to a bottom surface 113 of substrate layer 101. In one example, barrier layer 102 may be discontinuous. Conductive member 103 may be Cu, W, Ni, Al, Au, Pt, Ru or another metal.

In an implementation, conductive member 103 may be an alloy material, consisting of two or more elements. In an implementation, conductive member 103 may include a light coupling or transmitting material. In some implementations, barrier layer 102 may have a significantly higher resistance than a conventional barrier layer for a TSV with a copper conductor. In some implementations, barrier layer 102 may be leakier than a conventional barrier layer, as well as more resistive than a conventional barrier layer, to provide a current conduction path.

Liner layer 204 may be a silicon-based dielectric material. Liner layer 204 for example may be an inorganic material such as SiC, diamond-like carbon, low dielectric constant material, $SiO_2$, SiN, siliconoxy nitride, zirconium oxide, oxides of tantalum, tetra-ethyl ortho-silicate ("TEOS"), a phosphor-silicate glass ("PSG"), a boro-phospho-silicate glass ("BPSG"), and the like. In an implementation, liner layer 204 may include a polymeric material coated by known processes, and in another implementation, liner layer 102 may include laminate or laminates of inorganic and organic material, and vice versa. By having a slightly lossy film structure, which is compatible with mainstream IC manufacturing processing, other materials, namely materials other than SiO$_2$, may be used for TSV liner layers.

Liner layer 204 may be formed as a porous material to provide a lossy interface between substrate layer 101 and barrier layer 102 to allow some charge leakage from TSVs 210 to substrate layer 101 to provide a conductive current path. Because barrier layer 102 extends into gaps or voids in liner layer 204 effectively a quasi-distributed resistive-capacitive network along interface or junctions 205 is provided between barrier layer 102 and liner layer 204.

In an implementation, liner layer 204 may be coated by PECVD, and such coated liner layer 204 may be stoichiometric and/or non-stoichiometric. For example, a silicon oxide or nitride layer may be silicon rich to form a leaky dielectric material. For silicon nitride, nitrogen gas may be used instead of ammonia to electrically fabricate silicon nitride layer. In some applications, liner layer 204 may include laminates as stoichiometric and non-stoichiometric inorganic layers. Also, portions of liner layer 204 may be fully stoichiometric while other portions may be non-stoichiometric.

Liner layer 204 may have a thickness in a range of approximately 0.1 to 5 nm to provide a sufficient porosity. By having a porous liner layer 204, charge trapping may be promoted in order to provide charge leakage to substrate layer 101.

However, because effectively a resistor is placed in parallel with a capacitor, such capacitor need not have a low dielectric constant. In other words, materials with a higher dielectric constant than SiO$_2$ may be used for liner layer 204 provided, however, such materials are formed to be lossy or porous within a controlled range so as to have a controlled leakage to provide a conductive current path.

By having a TSV 110 or 210, capacitance at a low frequency is substantially reduced. In other words, a low-frequency capacitance associated with a conventional liner causes dispersive response of a signal passing through a TSV, which degrades high-speed digital signal performance. However, by having a TSV 110 or 210 which is lossier than a conventional TSV, signal integrity at high frequency may be enhanced. This may be useful in single die, such as a single die with a high-speed serializer-deserializer ("SERDES"), with TSVs, as well as in stacked die, including without limitation multi-die DRAM stacks and Hybrid Memory Cubes ("HMCs"), where TSVs may be cascaded from die-to-die. Thus, for high frequency applications with cascaded dies, namely stacked die applications with frequency in excess of approximately 2 gigabits per second ("Gbps"), jitter may be reduced by using TSVs 110 and/or 210. For single die application, high frequency applications with a frequency in excess of approximately 20 Gbps may benefit from reduced jitter by using TSVs 110 and/or 210.

Figure 7:
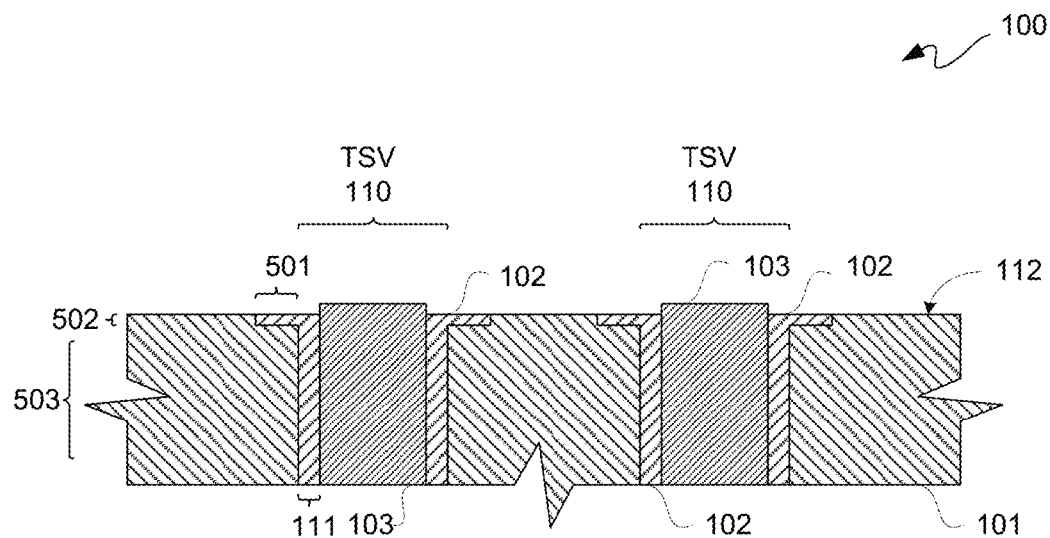
FIGS. 7 and 8 are block diagrams depicting respective cross-sectional views of substrates having via structures with collars.
Figure 8:
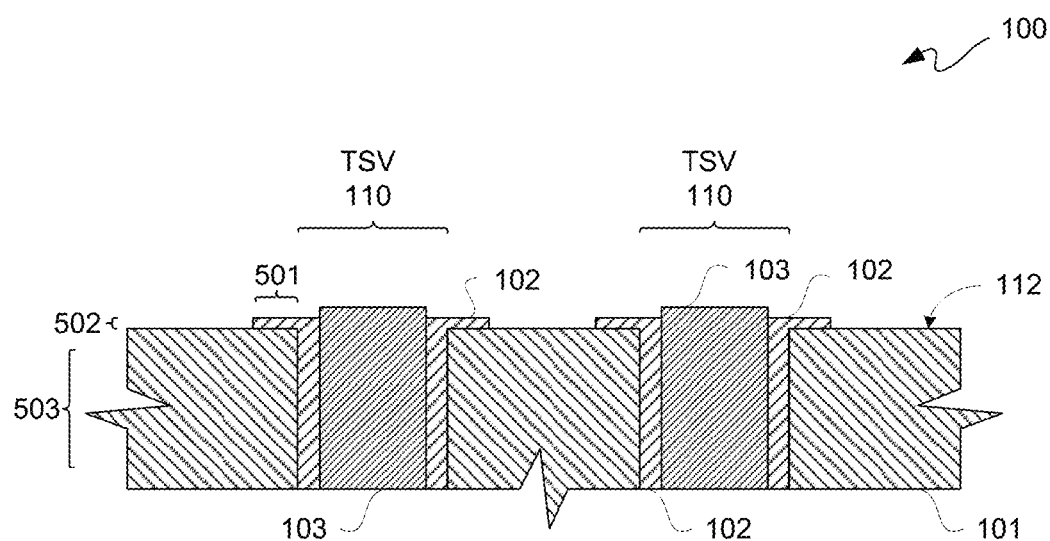

FIGS. 7 and 8 are block diagrams depicting respective cross-sectional views of substrates 100 having via structures with collars. Substrates 100 are further described with simultaneous reference to FIGS. 7 and 8.

TSVs 110 may have collars formed of barrier layer 102. Barrier layer 102 may have a thickness 111, as well as an additional thickness 501 for a collar around conductive member 103. In other words, an uppermost portion 502 of barrier layer 102 may extend substantially horizontally further away from conductive member 103 than a middle section 503 of barrier layer 102 in order to provide a flange or collar, namely "collar 501". Such collar 501 may increase contactable surface area so as to reduce contact resistance. Collar 501 may be formed with no additional mask layer than that used to form barrier layer 102, and/or redistribution layer ("RDL") buildup processing need not be employed with use of collar 501.

In FIG. 7, collar 501 has an uppermost surface that is generally planar with top surface 112 of substrate layer 101, and an uppermost surface of conductive member 103 may be at a higher elevation, namely extend above, top surface 112. In FIG. 8, substrate layer 101 of FIG. 7 has had an exposed top surface 112 portion etched back so that collar 501 extends above top surface 112.

Figure 9:
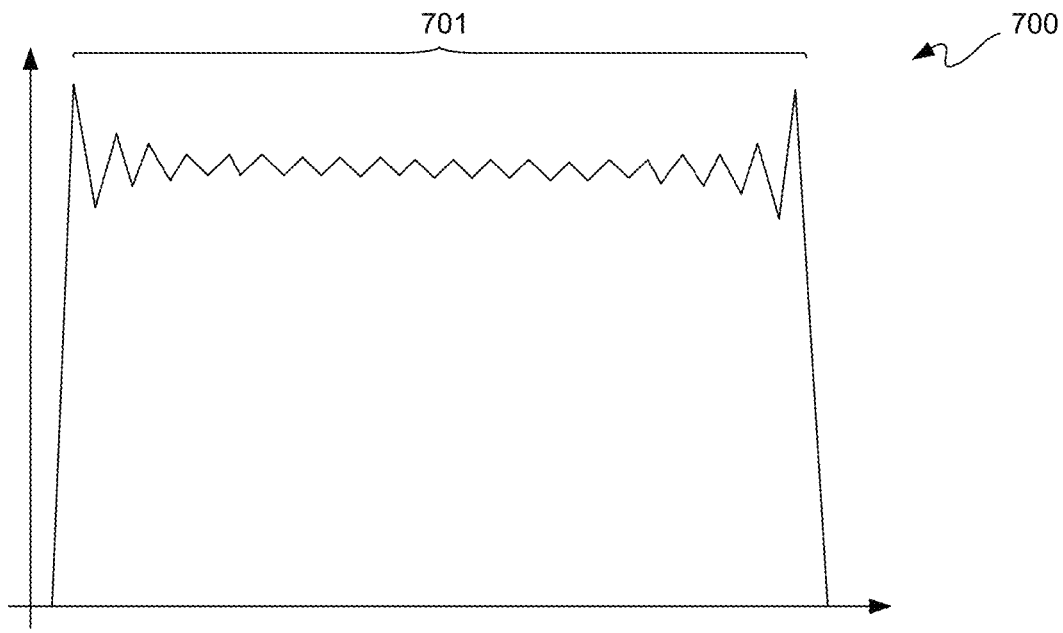
FIG. 9 is a signal diagram of time versus amplitude depicting an exemplary normalized signal of a spectrum of harmonic weights after passing through a theoretical ideal TSV.

Liner layer dielectric capacitance may negatively impact signal quality, particularly at high-frequencies. For example, when a signal, such as a square wave for example, passes through a TSV, such TSV may alter the weight of such signal's Fourier harmonics before combining harmonics at an output of a circuit or network. FIG. 9 is a signal diagram of time versus amplitude depicting an exemplary normalized signal 700 of a spectrum of harmonic weights after passing through a theoretical ideal TSV. In an ideal TSV, weight of each harmonic would be preserved such that there was no signal loss, meaning that normalized signal 700 may generally have a flat output 701 for different harmonic weights after passing through an ideal TSV, such that a digital square wave shape may be preserved.

Figure 10:
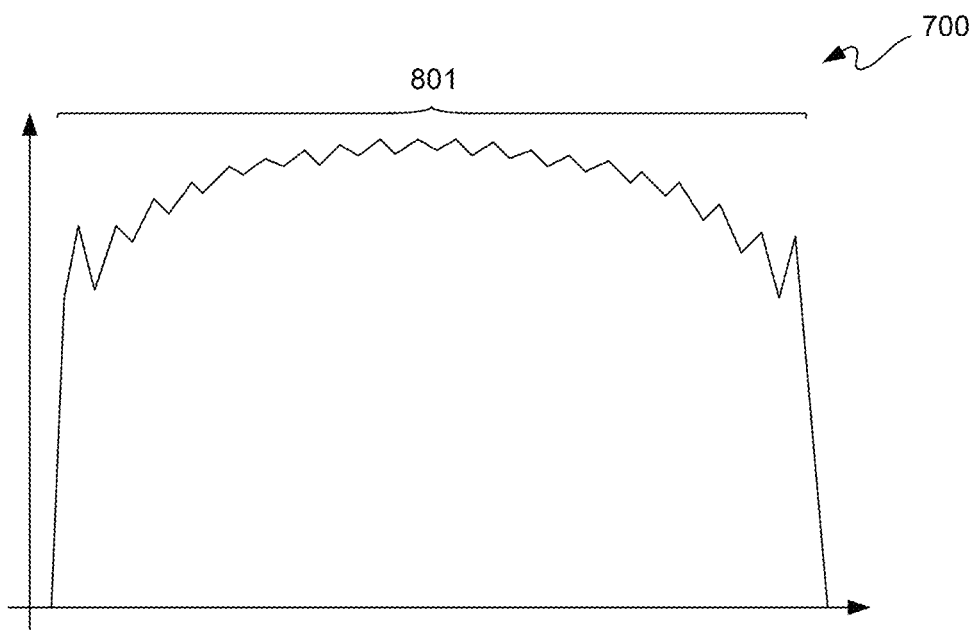
FIG. 10 is a signal diagram of time versus amplitude depicting the exemplary normalized signal of a spectrum of harmonic weights after passing through a conventional TSV.

FIG. 10 is a signal diagram of time versus amplitude depicting an exemplary normalized signal 700 of a spectrum of harmonic weights after passing through a conventional TSV. In a conventional TSV, there is less loss of harmonic weights at low frequencies than at high frequencies, meaning that normalized signal 700 may generally have a bowed output 801 for different harmonic weights after passing through a conventional TSV, such that a digital square wave shape has a significant amount of jitter. This jitter can negatively impact a signal eye, namely significantly constrain a signal eye.

Figure 11:
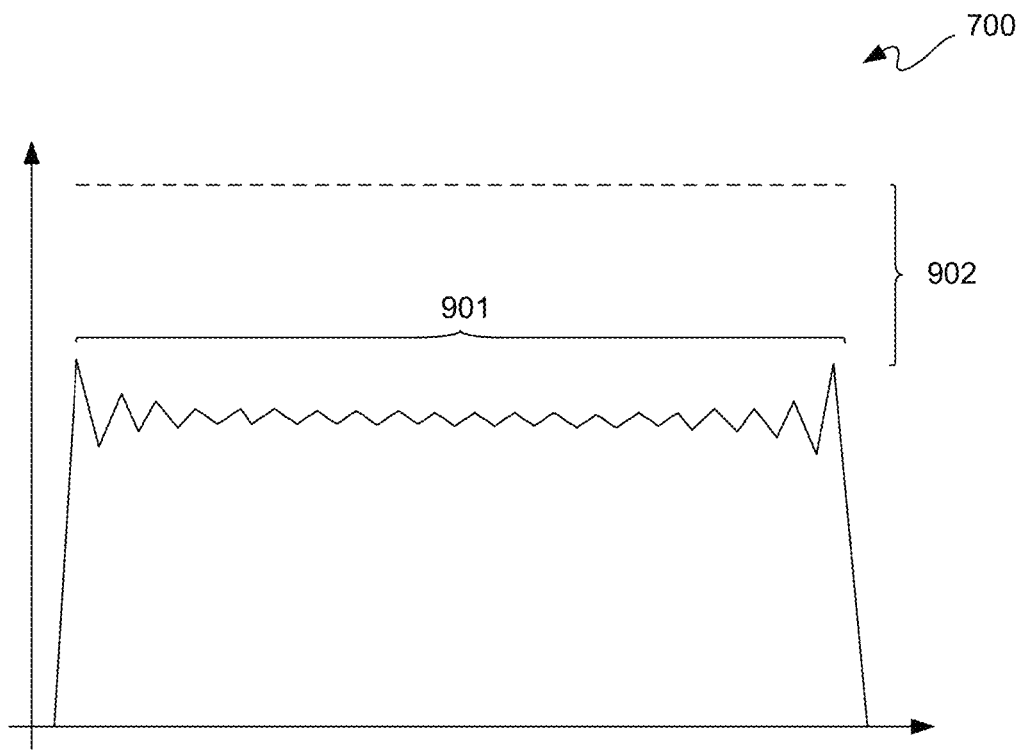
FIG. 11 is a signal diagram of time versus amplitude depicting the exemplary normalized signal of a spectrum of harmonic weights after passing through the TSV of FIG. 3 or the TSV of FIG. 4.

FIG. 11 is a signal diagram of time versus amplitude depicting an exemplary normalized signal 700 of a spectrum of harmonic weights after passing through a TSV 110 of FIG. 3 or TSV 210 of FIG. 4. In a TSV 110 or 210, there is more loss of harmonic weights, namely signal loss, at low frequencies than in a conventional TSV. This makes loss of harmonic weights at high frequencies and low frequencies more uniform than in a conventional TSV, meaning that normalized signal 700 may generally have an equalized flat output 901 for different harmonic weights after passing through a TSV 110 or 210, such that a digital square wave shape has a significant reduction in the amount of jitter as compared with a conventional TSV. This reduction in jitter can positively impact a signal eye, namely significantly expand a signal eye. However, by increasing low-frequency signal loss, namely reducing the weight of low-frequency harmonics f1 and f3, for a more uniform loss across a frequency spectrum, output signal amplitude is reduced, as generally indicated by difference 902, in favor of less jitter.

Figure 12:
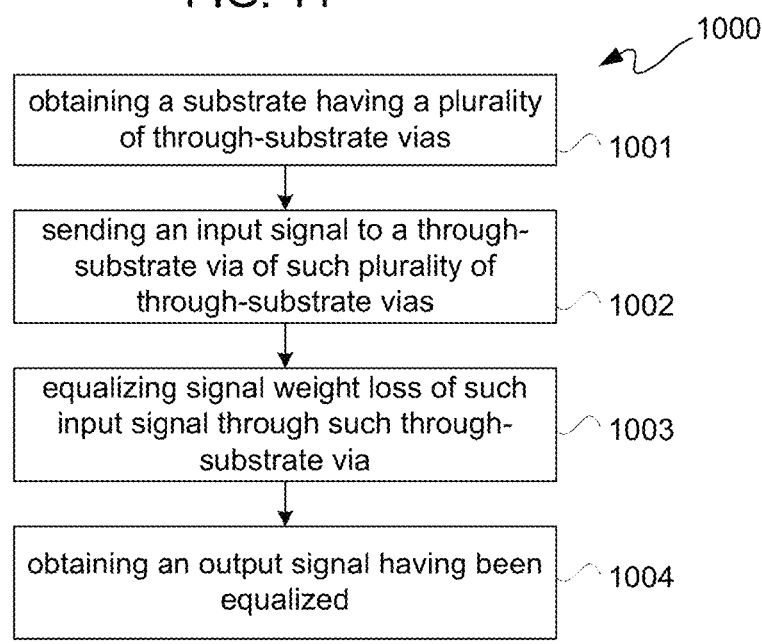
FIG. 12 is a flow diagram depicting an exemplary signal flow.

FIG. 12 is a flow diagram depicting an exemplary signal flow 1000. Signal flow 1000 is further described with simultaneous reference to FIGS. 3 through 12. At 1001, a substrate layer 101 having a plurality of through-substrate vias is obtained, such as TSVs 110 and/or 210. At 1002, an input signal is sent to a through-substrate via of such plurality of through-substrate vias, such as a TSV 110 or 210. At 1003, signal weight loss of such input signal is equalized for low-to-high frequency weights through such through-substrate via, where such plurality of through-substrate vias have lossy interfaces to substrate layer 101 to increase signal weight loss at low frequencies for such equalizing. At 1004, an output signal having been equalized is obtained from such through-substrate via. Such output signal approximates a square wave with a flatter and lower amplitude than without equalizing through such TSV 110 or 210.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method, comprising:
    obtaining a substrate having a plurality of through-substrate vias;
    sending an input signal to a through-substrate via of the plurality of through-substrate vias;
    equalizing signal weight loss of the input signal by passing through the through-substrate via;
    wherein the plurality of through-substrate vias have lossy interfaces to the substrate to increase the signal weight loss at low frequencies for equalization of the input signal;
    wherein the through-substrate via has a conductive current path from a conductive member of the through-substrate via to the substrate for the equalization of the input signal; and
    obtaining an output signal from the through-substrate via as an equalized form of the input signal.

2. The method according to claim 1, wherein the output signal approximates a square wave with a flatter and lower amplitude than without the equalizing.

3. The method according to claim 1, wherein:
    the substrate has a first surface and a second surface opposite the first surface, the first surface and the second surface defining a thickness of the substrate;
    the through-substrate via extends from the first surface of the substrate to the second surface of the substrate; and
    the through-substrate via has a first terminal at or proximate to the first surface and a second terminal at or proximate to the second surface provided by the conductive member of the through-substrate via extending from the first terminal to the second terminal;
    the input signal being sent from the first terminal to the second terminal; and
    the output signal being obtained from the second terminal.

4. The method according to claim 3, wherein:
    a barrier layer of the through-substrate via is disposed between at least a portion of the conductive member and the substrate; and
    the barrier layer includes a metal and a dielectric material for having a conductivity configured to offset a capacitance between the conductive member and the substrate when the input signal is passed through the through-substrate via.

5. The method according to claim 4, wherein the barrier layer has a film resistivity equal to or less than approximately 0.5 Ohm-cm to provide a resistance in parallel to the capacitance.

6. The method according to claim 4, wherein:
    the conductive member, the barrier layer, and the substrate in combination provide the capacitance in a range of approximately 50 fF to 2500 fF; and
    the through-substrate via does not include a liner layer.

7. The apparatus according to claim 4, wherein the barrier layer has a thickness in a range of approximately 1 to 50 nm.

8. The apparatus according to claim 4, wherein a portion of the barrier layer extends away from the conductive member in a horizontal direction to provide a collar.

9. The method according to claim 3, wherein:
    a liner layer of the through-substrate via is disposed between at least a portion of the barrier layer and the substrate;
    the barrier layer includes a metal in addition to a first dielectric material in order to provide a resistance in parallel with a parasitic capacitance associated in part with a second dielectric material of the liner layer of the through-substrate via as disposed in the substrate; and
    the barrier layer and the liner layer in combination provide a current conduction path configured to offset an effect of the parasitic capacitance that arises between the conductive member and the substrate when the input signal is passed through the conductive member of the through-substrate via.

10. The method according to claim 9, wherein the barrier layer has a film resistivity equal to or less than approximately 0.5 Ohm-cm to provide first parallel resistance for the resistance.

11. The method according to claim 9, wherein the liner layer has a film resistivity equal to or less than approximately 300 Ohm-cm.

12. The method according to claim 11, wherein thickness of the liner layer is in a range of approximately 0.1 to 5 nm to provide an electrical porosity.

13. The method according to claim 11, wherein the second dielectric material is selected from a group consisting of an organic material, an inorganic material, and a combination of the inorganic material and the organic material.

14. The method according to claim 11, wherein the resistance is approximately two orders of magnitude greater than a resistivity of the substrate.

15. The method according to claim 10, wherein the second dielectric material is silicon-based.

16. The method according to claim 10, wherein the liner layer is porous to allow the barrier layer to penetrate into the liner layer.

17. The method according to claim 16, wherein the barrier layer extends into interstitial gaps in the liner layer to provide a quasi-distributed resistive-capacitive network along an interface between the barrier layer and the liner layer.

18. The method according to claim 16, wherein the parasitic capacitance of the through-substrate via is in a range of approximately 50 to 2500 fF.

19. A method for a three-dimensional integrated circuit having a plurality of integrated circuit dies in a stack, comprising:
    sending an input signal to a through-substrate via of an integrated circuit die of the plurality of integrated circuit dies;
    equalizing signal weight loss of the input signal by passing through the through-substrate via;
    wherein the through-substrate via has a lossy interface to the integrated circuit die to increase the signal weight loss at low frequencies for equalization of the input signal;

wherein the through-substrate via has a conductive current path from a conductive member of the through-substrate via to the integrated circuit die for the equalization of the input signal; and obtaining an output signal from the through-substrate via as an equalized form of the input signal.

20. A method for improving a signal eye, comprising:

sending an input signal to a through-substrate via of a substrate;

reducing jitter of the input signal by passing the input signal through the through-substrate via;

wherein the through-substrate via has a lossy interface to the substrate to increase signal weight loss at low frequencies for equalization of the input signal for the reducing of the jitter;

wherein the through-substrate via has a conductive current path from a conductive member of the through-substrate via to the substrate for the reducing of the jitter of the input signal; and obtaining an output signal from the through-substrate via as a form of the input signal with the jitter reduced.

\* \* \* \* \*